United States Patent
Colgan et al.

(10) Patent No.: US 11,527,345 B2
(45) Date of Patent: Dec. 13, 2022

(54) WORKPIECE MAGNETIZING SYSTEM AND METHOD OF OPERATING

(71) Applicant: TOKYO ELECTRON LIMITED, Tokyo (JP)

(72) Inventors: Ian Colgan, County Meath (IE); Ioan Domsa, Dublin (IE); George Eyres, Dublin (IE); Toru Ishii, Dublin (IE); Makoto Saito, Dublin (IE); David Hurley, Dublin (IE); Noel O'Shaughnessy, Dublin (IE); Barry Clarke, Dublin (IE); Gerhardus Van Der Linde, Dublin (IE); Pat Hughes, Dublin (IE)

(73) Assignee: TOKYO ELECTRON LIMITED, Tokyo (JP)

( * ) Notice: Subject to any disclaimer, the term of this patent is extended or adjusted under 35 U.S.C. 154(b) by 751 days.

(21) Appl. No.: 16/466,824

(22) PCT Filed: Jan. 3, 2018

(86) PCT No.: PCT/IB2018/050045
§ 371 (c)(1),
(2) Date: Jun. 5, 2019

(87) PCT Pub. No.: WO2018/127814
PCT Pub. Date: Jul. 12, 2018

(65) Prior Publication Data
US 2019/0371506 A1 Dec. 5, 2019

Related U.S. Application Data

(60) Provisional application No. 62/441,849, filed on Jan. 3, 2017, provisional application No. 62/441,846, filed on Jan. 3, 2017.

(51) Int. Cl.
*H01F 13/00* (2006.01)
*C21D 1/26* (2006.01)
(Continued)

(52) U.S. Cl.
CPC ............. *H01F 13/003* (2013.01); *C21D 1/26* (2013.01); *G01R 33/02* (2013.01); *G01R 33/1215* (2013.01)

(58) Field of Classification Search
CPC .................................. C21D 1/26; H01F 13/00
See application file for complete search history.

(56) References Cited

U.S. PATENT DOCUMENTS

| | | |
|---|---|---|
| 2002/0182557 A1 | 12/2002 | Kuriyama et al. |
| 2014/0284321 A1 | 9/2014 | Ono et al. |
| 2016/0177412 A1 | 6/2016 | Ishii et al. |

FOREIGN PATENT DOCUMENTS

| | | |
|---|---|---|
| EP | 2405504 A1 | 1/2012 |
| GB | 2 339 968 A | 9/2000 |

(Continued)

OTHER PUBLICATIONS

International Search Report issued in Application No. PCT/IB2018/050045, dated Apr. 24, 2018, 4 pages.
(Continued)

*Primary Examiner* — Ramon M Barrera
(74) *Attorney, Agent, or Firm* — Weihrouch IP

(57) ABSTRACT

An apparatus for magnetic annealing one or more workpieces, and a method of operating the apparatus, are described. The apparatus includes: a workpiece holder configured to support one or more workpieces, wherein the one or more workpieces having at least one substantially planar surface; an optional workpiece heating system configured to elevate the one or more workpieces to an anneal temperature; and a magnet assembly having a first magnet and a
(Continued)

second magnet, the first and second magnets defining a gap between opposing poles of each magnet, wherein the magnet assembly is arranged to generate a magnetic field substantially perpendicular to the planar surface of the one or more workpieces.

29 Claims, 2 Drawing Sheets

(51) Int. Cl.
  *G01R 33/02* (2006.01)
  *G01R 33/12* (2006.01)

(56) References Cited

FOREIGN PATENT DOCUMENTS

| | | |
|---|---|---|
| JP | S54-146900 U | 10/1979 |
| JP | 2001102211 A | 4/2001 |
| JP | 2003023191 A | 1/2003 |
| JP | WO2010100728 A1 | 9/2012 |
| JP | WO2011048652 A1 | 3/2013 |
| JP | 2013-105769 A | 5/2013 |
| JP | 2014-183281 A | 9/2014 |

OTHER PUBLICATIONS

Japanese Office Action for JP Application No. 2019-535906 dated Feb. 8, 2022; 25 pp. (with English Translation).
Japanese Office Action for JP Application No. 2019-535906 dated Jul. 12, 2022; 12 pp. (with English Translation).

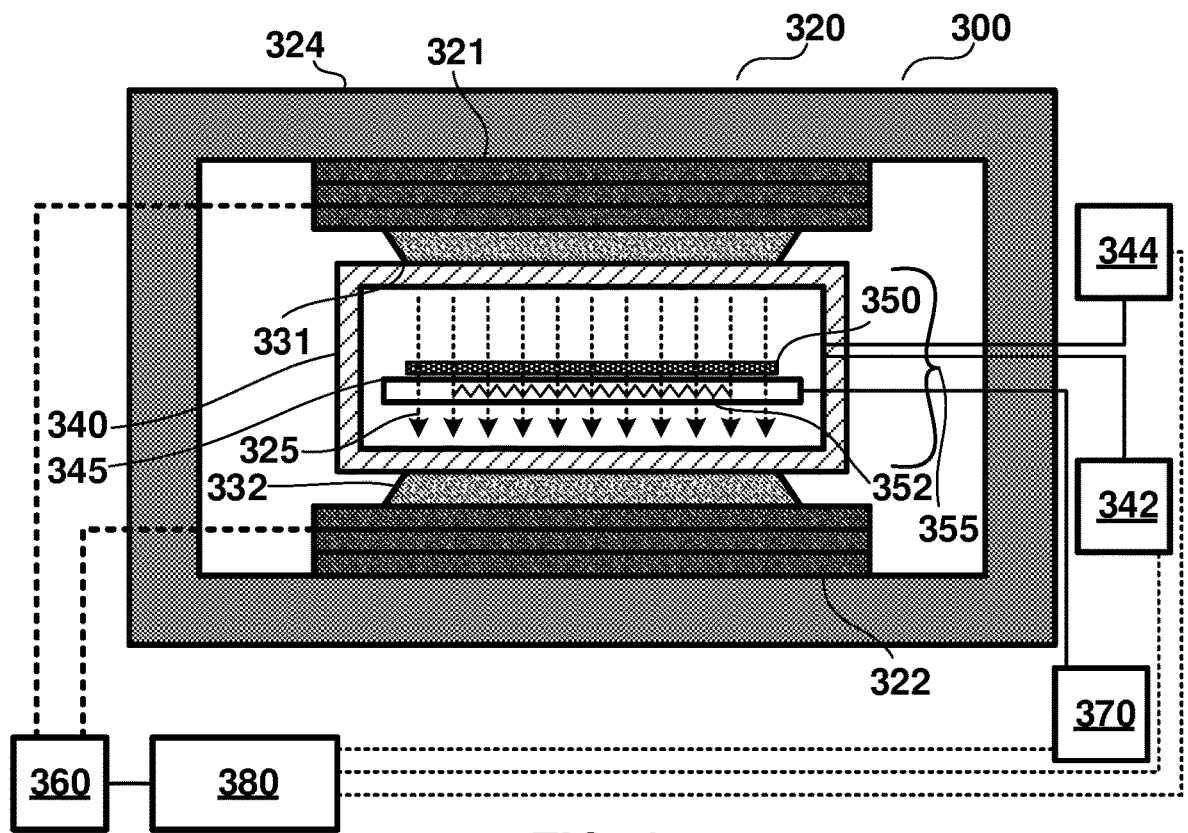

FIG. 3

```
                                                      400
                                                    ╱
┌─────────────────────────────────────────────────┐  410
│ Locating one or more workpieces on a workpiece  │ ╱
│ holder within a gap between opposing poles of a │
│ pair of magnets mounted in a magnetic assembly  │
└─────────────────────────────────────────────────┘
                          │
┌─────────────────────────────────────────────────┐  420
│ Generating a magnetic field substantially       │ ╱
│ perpendicular to an exposed planar surface of   │
│ the one or more workpieces                      │
└─────────────────────────────────────────────────┘
                          │
┌─────────────────────────────────────────────────┐  430
│ Magnetizing a layer on each of the one or more  │ ╱
│ workpieces                                      │
└─────────────────────────────────────────────────┘
                          │
┌─────────────────────────────────────────────────┐  440
│ Optionally, thermally processing the one or     │ ╱
│ more workpieces before, during, or after the    │
│ magnetizing                                     │
└─────────────────────────────────────────────────┘
                          │
┌─────────────────────────────────────────────────┐  450
│ Achieving a workpiece throughput in excess of   │ ╱
│ 10 workpieces per hour                          │
└─────────────────────────────────────────────────┘
```

FIG. 4

WORKPIECE MAGNETIZING SYSTEM AND METHOD OF OPERATING

CROSS REFERENCE TO RELATED APPLICATION

This application is a 35 U.S.C. 371 National Phase Entry Application from PCT/IB2018/050045, filed Jan. 3, 2018, which claims priority to U.S. Provisional Application No. 62/441,846, filed Jan. 3, 2017, and U.S. Provisional Application No. 62/441,849, filed Jan. 3, 2017, the disclosures of which are incorporated herein in their entirety by reference, and priority is claimed to each of the foregoing.

FIELD OF INVENTION

The invention relates to a magnetizing system and method for processing a microelectronic workpiece, and in particular, a system and method for magnetizing material on a workpiece for electronic device applications.

BACKGROUND OF THE INVENTION

Magnetizing equipment with and without annealing is important for electronic device applications, and more specifically, it is necessary for manufacturing magneto-resistive random access memory (MRAM) devices compatible with conventional complementary metal oxide semiconductor (CMOS) logic based microelectronic workpieces. To successfully magnetically anneal a workpiece, the magnetic domains of the workpiece, e.g., magnetic layer(s), must be held at a predetermined temperature in a pre-determined magnetic field for a period of time long enough for the crystals to orient themselves in a common direction upon cooling. This process, which is also referred to as "soak" is carried out in an inert, reducing, or vacuum environment to prevent oxidation of the workpiece, while the workpiece is held at the predetermined temperature.

Magnetizing and magnetic annealing equipment generally operates in batch-mode, i.e., plural workpieces are annealed at the same time, and performs a sequence of steps. As an example, these steps include heating, soaking, and cooling the workpieces in the presence of a magnetic field, typically between 0.02 and 7 T (Tesla). The cost of MRAM device manufacturing is linked to the magnetic annealing tools, where the productivity (acceptable devices produced per hour) is the product of density (number of devices per workpiece), throughput (workpieces per hour), and yield (ratio of acceptable devices to total number of devices processed), as dictated by the overall thermal/anneal cycle.

Conventionally, magnetic annealing systems have long temperature ramp-up and ramp-down cycle times, thus leading to reduced throughput. And, with manufacturing facility floor-space being a premium, workpiece throughput is critical for successful implementation.

SUMMARY

Techniques herein pertain to a magnetizing system and method for processing a microelectronic workpiece, and in particular, a system and method for magnetizing material on a workpiece for electronic device applications.

According to one embodiment, an apparatus for magnetizing and optionally annealing one or more workpieces, and a method of operating the apparatus, are described. The apparatus includes a workpiece holder configured to support one or more workpieces, wherein the one or more workpieces having at least one substantially planar surface; and a magnet assembly having a first magnet and a second magnet, the first and second magnets defining a gap between opposing poles of each magnet, wherein the magnet assembly is arranged to generate a magnetic field substantially perpendicular to the planar surface of the one or more workpieces.

According to another embodiment, an apparatus for magnetizing one or more workpieces is described. The apparatus includes: a workpiece holder configured to support one or more workpieces, the one or more workpieces having at least one substantially planar surface; and a magnet assembly having a first magnet and a second magnet, the first and second magnets defining a gap between opposing poles of each magnet, wherein the magnet assembly is arranged to generate a magnetic field substantially perpendicular to the planar surface of the one or more workpieces, and wherein the field uniformity of the magnetic field generated by the magnet assembly is less than a 10% variation across the diameter or major lateral dimension of the one or more workpieces, the percent variation being measured as a maximum variation in the magnetic field strength across at least one workpiece divided by the average field strength across the at least one workpiece.

According to another embodiment, an apparatus for magnetizing one or more workpieces is described. The apparatus includes: a workpiece holder configured to support one or more workpieces, the one or more workpieces having at least one substantially planar surface; and a magnet assembly having a first magnet and a second magnet, the first and second magnets defining a gap between opposing poles of each magnet, wherein the magnet assembly is arranged to generate a magnetic field substantially perpendicular to the planar surface of the one or more workpieces, and wherein the magnet assembly generates a magnetic field substantially perpendicular to the planar surface of the one or more workpieces across an area in excess of 10 cm$^2$.

According to another embodiment, method for magnetizing one or more workpieces is described. The method includes: locating one or more workpieces on a workpiece holder within a gap between opposing poles of a pair of magnets mounted in a magnetic assembly; generating a magnetic field substantially perpendicular to an exposed planar surface of the one or more workpieces; magnetizing a layer on each of the one or more workpieces; optionally, thermally processing the one or more workpieces before, during, or after the magnetizing; and achieving a workpiece throughput in excess of 10 workpieces per hour, wherein the field uniformity of the magnetic field generated by the magnet assembly is less than a 10% variation across the diameter or major lateral dimension of the one or more workpieces, the percent variation being measured as a maximum variation in the magnetic field strength across at least one workpiece divided by the average field strength across the at least one workpiece, or wherein the magnetic assembly generates a magnetic field substantially perpendicular to the planar surface of the one or more workpieces across an area in excess of 10 cm$^2$.

According to another embodiment, an apparatus for magnetic annealing one or more workpieces, and a method of operating the apparatus, are described. The apparatus includes: a workpiece holder configured to support one or more workpieces, wherein the one or more workpieces having at least one substantially planar surface; a workpiece heating system configured to elevate the one or more workpieces to an anneal temperature; and a magnet assembly having a first magnet and a second magnet, the first and second magnets defining a gap between opposing poles of each magnet, wherein the magnet assembly is arranged to generate a magnetic field substantially perpendicular to the planar surface of the one or more workpieces.

According to yet another embodiment, method for magnetizing one or more workpieces is described. The method includes: locating one or more workpieces on a workpiece holder within a gap between opposing poles of a pair of magnets mounted in a magnetic assembly; generating a magnetic field substantially perpendicular to an exposed planar surface of the one or more workpieces; magnetizing a layer on each of the one or more workpieces; thermally processing the one or more workpieces before, during, or after the magnetizing by elevating the temperature of the one or more workpieces to an anneal temperature ranging up to 600 degrees Centigrade; and achieving a workpiece throughput in excess of 10 workpieces per hour, wherein the field uniformity of the magnetic field generated by the magnet assembly is less than a 10% variation across the diameter or major lateral dimension of the one or more workpieces, the percent variation being measured as a maximum variation in the magnetic field strength across at least one workpiece divided by the average field strength across the at least one workpiece, or wherein the magnetic assembly generates a magnetic field substantially perpendicular to the planar surface of the one or more workpieces across an area in excess of 10 cm$^2$.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

In the accompanying drawings:

FIG. 3 illustrates a magnetic annealing system according to another embodiment; and FIG. 4 illustrates a method of magnetizing or magnetic annealing a workpiece according to yet another embodiment.

DETAILED DESCRIPTION

Figure 1:
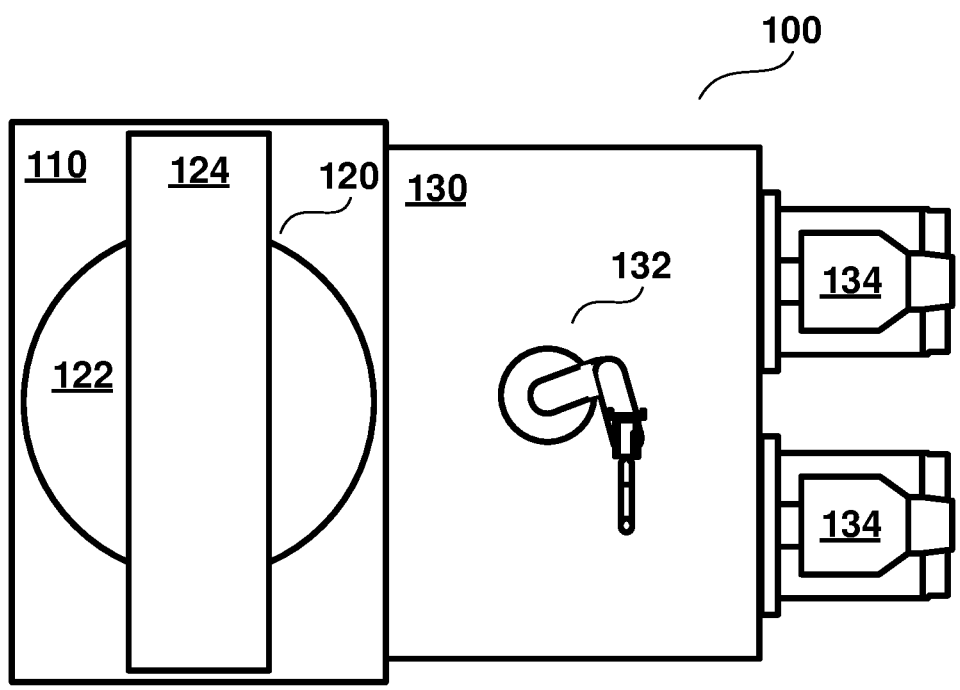
FIG. 1 provides a schematic representation of a magnetic and/or annealing system according to an embodiment.

Systems and methods for magnetizing or magnetic annealing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As briefly described above, magnetic annealing systems have long temperature ramp-up and ramp-down cycle times, thus leading to reduced throughput. And, with manufacturing facility floor-space being a premium, workpiece throughput is critical for successful implementation. According to several embodiments, a magnetizing system and a magnetic annealing system are described for single workpiece treatment, or multi-workpiece treatment, wherein the number of workpieces is ten (10) or less. According to several additional embodiments, a magnetizing system and a magnetic annealing system are described for simultaneous, full-workpiece treatment. Furthermore, according to several additional embodiments, a magnetizing system and a magnetic annealing system are described for perpendicular magnetic treatment of the workpiece(s). Methods of operating the systems are also described according to various embodiments.

Therefore, referring now to the drawings, wherein like reference numerals designate identical or corresponding parts throughout the several views, FIG. 1 provides a schematic representation of a magnetic and/or annealing system according to an embodiment. Magnetic treatment system 100 includes magnetic treatment chamber 110, coupled to workpiece handling chamber 130 configured to receive one or more workpieces from workpiece bays 134, and convey the one or more workpieces using workpiece handler 132. The magnetic chamber 110 can be coupled to other platform configurations, including cluster-tool platforms.

The magnetic treatment chamber 130 can be configured to perform a magnetizing treatment of a workpiece, or a magnetic annealing treatment of a workpiece. The workpiece can include magnetic domains, or layers, composed of magnetic material. The magnetic material can include metal alloys composed of metals, such as cobalt, platinum, iron, manganese, nickel, chromium, vanadium, and the like. Magnetic treatment chamber 110 includes magnetic assembly 120, wherein the magnetic assembly 120 includes one or more magnets 122 and a magnetic circuit 124 (e.g., an H-frame) to which the one or more magnets are mounted. The magnetic treatment system 100 can be configured for single workpiece treatment, or multi-workpiece treatment, wherein the number of workpieces is ten (10) or less. The number of workpieces can depend on the size of the gap afforded by the arrangement of one or more magnets (to be described below).

The magnetic treatment system 100 can be configured for simultaneous, full-workpiece treatment. The field uniformity of the magnetic field generated by the magnet assembly is less than a 10% variation across the diameter or major lateral dimension of the one or more workpieces, wherein the percent variation being measured as a maximum variation in the magnetic field strength across at least one workpiece divided by the average field strength across the at least one workpiece. The field uniformity can be less than 5%, or even less than or equal to 2%.

The magnetic treatment system 100 can be configured for perpendicular magnetic treatment of the workpiece(s). The magnetic field can be designed to have a perpendicular orientation relative to at least one substantially planar surface of the one or more workpieces on an area exceeding 10 cm$^2$ up to the full area of the workpiece.

Figure 2:
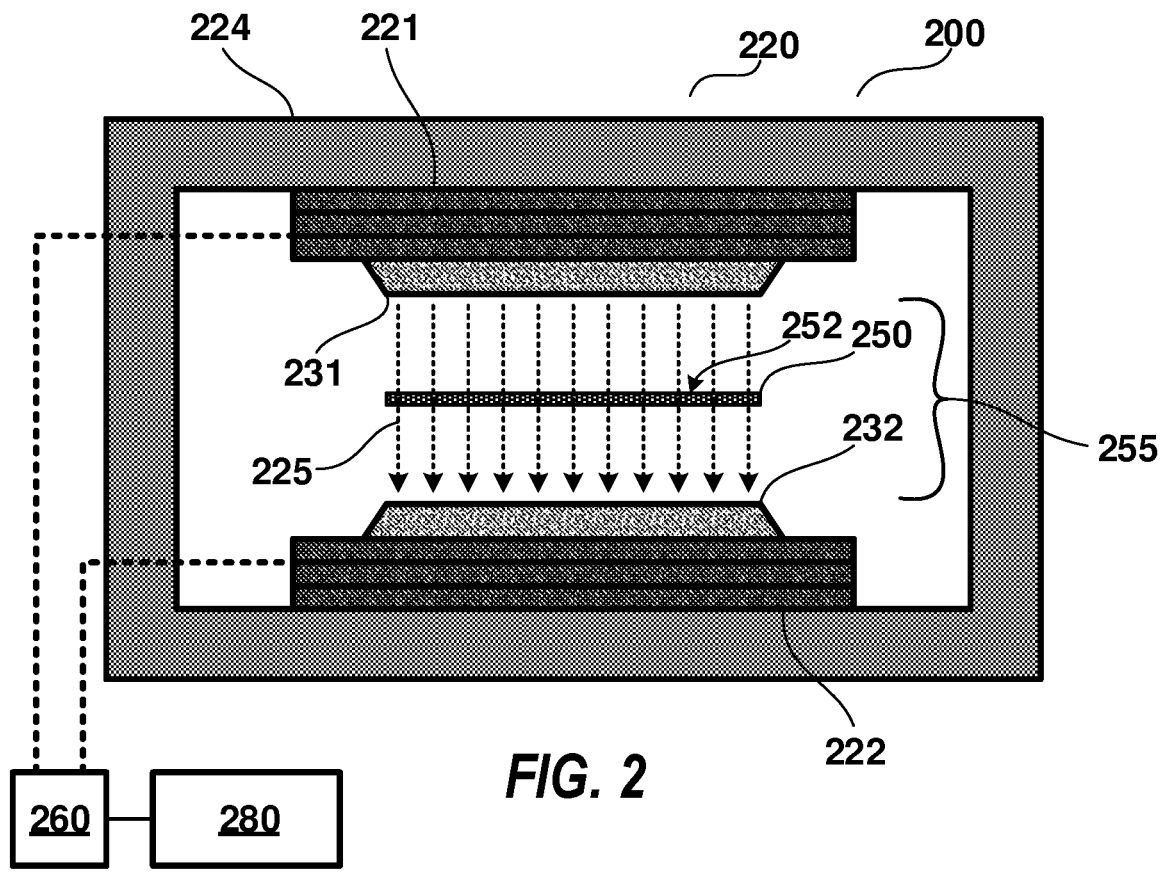
FIG. 2 illustrates a magnetizing system according to an embodiment.

FIG. 2 illustrates a magnetizing system 200 according to an embodiment. Magnetizing system 200 includes a workpiece holder (not shown) configured to support one or more workpieces 250, wherein the one or more workpieces 250 have at least one substantially planar surface 252, and a magnet assembly 220 having a first magnet 221 and a second magnet 222, wherein the first and second magnets 221, 222 define a gap 255 between opposing poles of each magnet, wherein the magnet assembly is arranged to generate a magnetic field 225 substantially perpendicular to the planar surface 252 of the one or more workpieces 250. The one or more workpieces 250 include wafer or panel substrates having a diameter or lateral dimension equal to or greater than 100 mm or 200 mm.

The magnet assembly can generate a magnetic field 225 having a field strength up to 3T (Tesla). Alternatively, the magnetic field strength can range up to 2T, or 1T, or even 0.1 T. The magnetizing system 200 can be configured for single workpiece treatment, or multi-workpiece treatment, wherein the number of workpieces is ten (10) or less. The number of workpieces can depend on the size of the gap 255 afforded by the arrangement of one or more magnets. As an example, the gap 255 may range up to 20 mm for a 2T magnetic field, and thus, provide space for a single workpiece. As another example, the gap 255 may range up to 80 mm for a 1T magnetic field, and thus, provide space for up to five (5) workpieces. And, as another example, the gap 255 may range up to 200 mm for a 0.1 T magnetic field, and thus, provide space for up to ten (10) workpieces.

The magnetizing system 200 can be configured for simultaneous, full-workpiece treatment. The field uniformity of the magnetic field generated by the magnet assembly is less than a 10% variation across the diameter or major lateral dimension of the one or more workpieces, wherein the percent variation being measured as a maximum variation in the magnetic field strength across at least one workpiece divided by the average field strength across the at least one workpiece. The field uniformity can be less than 5%, or even less than or equal to 2%.

The magnetizing system 200 can be configured for perpendicular magnetic treatment of the workpiece(s). The magnetic field can be designed to have a non-parallel or perpendicular orientation relative to at least one substantially planar surface of the one or more workpieces on an area exceeding 10 cm$^2$ up to the full area of the workpiece.

Magnet assembly 220 includes first and second magnets 221, 222, wherein at least one of the first magnet 221 and the second magnet 222 is a permanent magnet or an electromagnet. In one embodiment, the first and second magnets 221, 222 are electro-magnets. The coil winding of each of the first magnet 221 and the second magnet 222 can be independently powered and controlled by at least one power source 260. The power source 260 can provide independent delivery of desired power levels to the individual cons of a magnet or plural magnets.

The magnet assembly 220 can include an H-frame 224 for mounting the first and second magnets 221, 222 to complete the magnetic field circuit. Furthermore, a first magnetic pole piece 231 arranged proximate a first pole of the first magnet 221, and located adjacent the one or more workpieces 250, and a second magnetic pole piece 232 arranged proximate a second pole of the second magnet 222, and located adjacent the one or more workpieces 250. The first and second magnetic pole pieces 231, 232 can be fabricated of a magnetically permeable material that supports an intense magnetic field when energized by the current-carrying coils. Such materials are well-known in the art, and include: a ferromagnetic material, e.g., iron, ferrite, iron laminates, and iron alloys; metal-silicon alloys; mu-metal, permalloy, or supermalloy, e.g., nickel-iron alloy; vitreous metal, e.g., METGLAS®; and the like. Permeability of the magnetic core material of the poles may be adjusted to direct magnetic field lines toward the planar surface of the workpiece.

Magnetizing system 200 can also include a controller 280 coupled to the power source 260, and configured to send and receive programmable instructions and data to and from the components of the magnetizing system 200. For example, the controller 280 may be programmed to control the magnetic field shape, orientation, strength, intensity, etc., the magnetizing time duration, and the temporal and/or spatial variation of any of these process parameters.

FIG. 3 illustrates a magnetic annealing system 300 according to an embodiment. Magnetic annealing system 300 includes a workpiece holder 345 configured to support one or more workpieces 350, wherein the one or more workpieces 350 have at least one substantially planar surface 352, and a magnet assembly 320 having a first magnet 321 and a second magnet 322, wherein the first and second magnets 321, 322 define a gap 355 between opposing poles of each magnet, wherein the magnet assembly is arranged to generate a magnetic field 325 substantially perpendicular to the planar surface 352 of the one or more workpieces 350. The one or more workpieces 350 include wafer or panel substrates having a diameter or lateral dimension equal to or greater than 100 mm or 200 mm. The workpiece holder 345 can be configured to electrically or mechanically clamp the one or more workpieces 350 to an upper surface thereof.

The magnet assembly can generate a magnetic field 325 having a field strength up to 3T (Tesla). Alternatively, the magnetic field strength can range up to 2T, or 1T, or even 0.1 T. The magnetic annealing system 300 can be configured for single workpiece treatment, or multi-workpiece treatment, wherein the number of workpieces is ten (10) or less. The number of workpieces can depend on the size of the gap 355 afforded by the arrangement of one or more magnets. As an example, the gap 355 may range up to 20 mm for a 2T magnetic field, and thus, provide space for a single workpiece. As another example, the gap 355 may range up to 80 mm for a 1T magnetic field, and thus, provide space for up to five (5) workpieces. And, as another example, the gap 355 may range up to 300 mm for a 0.1 T magnetic field, and thus, provide space for up to ten (10) workpieces.

The magnetic annealing system 300 can be configured for simultaneous, full-workpiece treatment. The field uniformity of the magnetic field generated by the magnet assembly is less than a 10% variation across the diameter or major lateral dimension of the one or more workpieces, wherein the percent variation being measured as a maximum variation in the magnetic field strength across at least one workpiece divided by the average field strength across the at least one workpiece. The field uniformity can be less than 5%, or even less than or equal to 2%.

The magnetic annealing system 300 can be configured for perpendicular magnetic treatment of the workpiece(s). The magnetic field can be designed to have a non-parallel or perpendicular orientation relative to at least one substantially planar surface of the one or more workpieces on an area exceeding 10 cm$^2$ up to the full area of the workpiece.

Magnet assembly 320 includes first and second magnets 321, 322, wherein at least one of the first magnet 321 and the second magnet 322 is a permanent magnet or an electromagnet. In one embodiment, the first and second magnets 321, 322 are electro-magnets. The coil winding of each of the first magnet 321 and the second magnet 322 can be independently powered and controlled by at least one power source 360. The power source 360 can provide independent delivery of desired power levels to the individual coils of a magnet or plural magnets.

The magnet assembly 320 can include an H-frame 224 for mounting the first and second magnets 321, 322 to complete the magnetic field circuit. Furthermore, a first magnetic pole piece 331 arranged proximate a first pole of the first magnet 321, and located adjacent the one or more workpieces 350, and a second magnetic pole piece 332 arranged proximate a second pole of the second magnet 322, and located adjacent the one or more workpieces 350. The first and second magnetic pole pieces 331, 332 can be fabricated of a magnetically permeable material that supports an intense magnetic field when energized by the current-carrying cons. Such materials are well-known in the art, and include: a ferromagnetic material, e.g., iron, ferrite, iron laminates, and iron alloys; metal-silicon alloys; mu-metal, permalloy, or supermalloy, e.g., nickel-iron alloy; vitreous metal, e.g., METGLAS®; and the like. Permeability of the magnetic core material of the poles may be adjusted to direct magnetic field lines toward the planar surface of the workpiece.

As shown in FIG. 3, magnetic annealing system 300 includes a vacuum chamber 340 defining an interior space to arrange the substrate holder 345 and one or more workpieces 350 in a vacuum environment, wherein the vacuum chamber 340 is disposed within the gap 355 between the first and second magnets 321, 322. The vacuum chamber 340 can be coupled to a vacuum pump 342 to evacuate the vacuum chamber 340. Furthermore, the vacuum chamber 340 can be coupled to a gas delivery system 344 to receive a flow of gas before, during, or after treatment of the one or more workpieces 350. The vacuum pump 342 can maintain the vacuum environment in the vacuum chamber 340 at a pressure ranging from $10^{-7}$ Torr to 10 Torr. The gas delivery system 344 can supply an inert gas or reducing gas to the vacuum chamber 340.

Magnetic annealing system 300 further includes a workpiece heating system configured to elevate the one or more workpieces 350 to an anneal temperature, which can range up to 600 degrees Centigrade. The workpiece heating system can heat the one or more workpieces 350 by radiation, conduction, convection, or induction, or any combination of two or more heating mechanisms. The workpiece heating system can include a resistive heating element 352 coupled to the workpiece holder (as shown in FIG. 3), or coupled to the vacuum chamber 340 within which the workpiece holder 345 and one or more workpieces 350 are mounted, or coupled to both. Alternatively, the workpiece heating system can include an electromagnetic source arranged to illuminate at least a part of the one or more workpieces 350 with a beam of energy, and scan the beam of energy across the planar surface of the one or more workpieces 350. The workpiece heating system can be coupled to a temperature controller 370 programmably configured to controllably elevate a temperature for each of the one or more workpieces 350 to a pre-determined temperature range including the anneal temperature.

Magnetic annealing system 300 can also include a controller 380 coupled to the power source 360, temperature controller 370, vacuum chamber 340, vacuum pump 342, and gas delivery system 344, and configured to send and receive programmable instructions and data to and from the components of the magnetizing system 200. For example, the controller 380 may be programmed to control the magnetic field shape, orientation, strength, intensity, etc., the magnetic annealing time duration, pressure, temperature, gas flow rate, and the temporal and/or spatial variation of any of these process parameters.

Referring now to FIG. 4, a method 400 of magnetizing or magnetic annealing a workpiece is shown according to yet another embodiment. The method 400 includes: in 410, locating one or more workpieces on a workpiece holder within a gap between opposing poles of a pair of magnets mounted in a magnetic assembly; in 420, generating a magnetic field substantially perpendicular to an exposed planar surface of the one or more workpieces; in 430, magnetizing a layer on each of the one or more workpieces; in 440, optionally, thermally processing the one or more workpieces before, during, or after the magnetizing; and in 450, achieving a workpiece throughput in excess of 10 workpieces per hour, wherein the field uniformity of the magnetic field generated by the magnet assembly is less than a 10% variation across the diameter or major lateral dimension of the one or more workpieces, the percent variation being measured as a maximum variation in the magnetic field strength across at least one workpiece divided by the average field strength across the at least one workpiece, or wherein the magnetic assembly generates a magnetic field substantially perpendicular to the planar surface of the one or more workpieces across an area in excess of 10 cm$^2$.

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. An apparatus for magnetizing one or more workpieces, comprising:
a magnet assembly having a first magnet and a second magnet, the first magnet and the second magnet being electro-magnets, the first and second magnets defining a gap between opposing poles of each magnet, wherein the magnet assembly is arranged to generate a magnetic field substantially perpendicular to the planar surface of the one or more workpieces, and
a workpiece holder configured to support one or more workpieces, the one or more workpieces having each at least one substantially planar surface, within said gap between the opposing poles of each magnet;
a power source configured to independently deliver power levels to individual coil windings of the first and second magnets; and
a controller coupled to the power source and programmable,
wherein the controller is configured to control the magnetic field to have a field uniformity having less than a 10% variation across the diameter or major lateral dimension of the one or more workpieces, and
wherein the percent variation is measured as a maximum variation in a magnetic field strength across at least one workpiece divided by the average field strength across the at least one workpiece.

2. The apparatus of claim 1, wherein the one or more workpieces includes ten (10) or fewer workpieces.

3. The apparatus of claim 1, wherein the one or more workpieces is a single workpiece.

4. The apparatus of claim 1, wherein the controller is configured to control a magnetic field strength of the magnetic field generated by the magnet assembly to range up to 2T.

5. The apparatus of claim 4, wherein the gap ranges up to and including 20 mm (millimeters).

6. The apparatus of claim 1, wherein the controller is configured to control a magnetic field strength of the magnetic field generated by the magnet assembly to range up to 1 T.

7. The apparatus of claim 6, wherein the gap ranges up to and including 80 mm (millimeters).

8. The apparatus of claim 1, wherein the controller is configured to control a magnetic field strength of the magnetic field generated by the magnet assembly to range up to 0.1 T.

9. The apparatus of claim 8, wherein the gap ranges up to and including 200 mm (millimeters).

10. The apparatus of claim 1, wherein the one or more workpieces include wafer or panel substrates having a diameter or lateral dimension equal to or greater than 200 mm.

11. The apparatus of claim 5, wherein the field uniformity of the magnetic field generated by the magnet assembly is less than a 5% variation across the diameter or major lateral dimension of the one or more workpieces.

12. The apparatus of claim 5, wherein the field uniformity of the magnetic field generated by the magnet assembly is less than or equal to a 2% variation across the diameter or major lateral dimension of the one or more workpieces.

13. The apparatus of claim 1, wherein the magnet assembly further includes: an H-frame for mounting the first and second magnets to complete the magnetic field circuit.

14. The apparatus of claim 1, wherein the magnet assembly further includes:
a first magnetic pole piece arranged proximate a first pole of the first magnet, and located adjacent the one or more workpieces; and
a second magnetic pole piece arranged proximate a second pole of the second magnet, and located adjacent the one or more workpieces.

15. The apparatus of claim 1,
wherein the magnetic assembly generates a magnetic field substantially perpendicular to the planar surface of the one or more workpieces across an area in excess of 10 cm$^2$.

16. The apparatus for magnetizing one or more workpieces according to claim 1, further comprising:
a workpiece heating system configured to elevate the one or more workpieces to an anneal temperature.

17. The apparatus of claim 16, wherein the magnet assembly further includes:
an H-frame for mounting the first and second magnets to complete the magnetic field circuit;
a first magnetic pole piece arranged proximate a first pole of the first magnet, and located adjacent the one or more workpieces; and a second magnetic pole piece arranged proximate a second pole of the second magnet, and located adjacent the one or more workpieces.

18. The apparatus of claim 16, further comprising: a vacuum chamber defining an interior space to arrange the workpiece holder and one or more workpieces in a vacuum environment, wherein the vacuum chamber is disposed within the gap between the first and second magnets.

19. The apparatus of claim 18, wherein the vacuum chamber maintains the vacuum environment at a pressure ranging from $10^{-7}$ Torr to 10 Torr.

20. The apparatus of claim 18, wherein the vacuum chamber is coupled to a gas delivery system configured to supply a gas to the vacuum environment.

21. The apparatus of claim 20, wherein the gas includes an inert gas or reducing gas.

22. The apparatus of claim 16, wherein the anneal temperature ranges up to 600 degrees Centigrade.

23. The apparatus of claim 16, wherein the workpiece heating system is configured to heat the one or more workpieces by radiation, conduction, convection, or induction, or any combination of two or more heating mechanisms.

24. The apparatus of claim 18, wherein the workpiece heating system is coupled to a temperature controller programmably configured to controllably elevate a temperature for each of the one or more workpieces to a pre-determined temperature range including the anneal temperature.

25. The apparatus of claim 18, wherein the workpiece heating system includes a resistive heating element coupled to the workpiece holder, or coupled to the vacuum chamber within which the workpiece holder and one or more workpieces are mounted, or coupled to both.

26. The apparatus of claim 18, wherein the workpiece heating system includes an electromagnetic source arranged to illuminate at least a part of the one or more workpieces with a beam of energy, and scan the beam of energy across the planar surface of the one or more workpieces.

27. A method for magnetizing one or more workpieces, comprising:
    locating one or more workpieces on a workpiece holder within a gap between opposing poles of a first magnet and a second magnet mounted in a magnetic assembly arranged to generate a magnetic field;
    generating said magnetic field substantially perpendicular to an exposed planar surface of the one or more workpieces, wherein the first magnet and the second magnet are electro-magnets;
    independently delivering, from a power source, power levels to individual coil windings of first and second magnets of a magnet assembly; and
    using a programmable controller coupled to the power source to control the magnetic field to have a field uniformity having less than a 10% variation across the diameter or major lateral dimension of the one or more workpieces, wherein the percent variation is measured as a maximum variation in a magnetic field strength across at least one workpiece divided by the average field strength across the at least one workpiece.

28. The method of claim 27, wherein a magnetic field strength generated by the magnet assembly ranges up to 3T.

29. The method for magnetizing one or more workpieces according to claim 27, further comprising:
    thermally processing the one or more workpieces before, during, or after the magnetizing by elevating the temperature of the one or more workpieces to an anneal temperature ranging up to 600 degrees Centigrade.

* * * * *